(12) United States Patent
Jasinski et al.

(10) Patent No.: US 6,426,890 B1
(45) Date of Patent: Jul. 30, 2002

(54) SHARED GROUND SRAM CELL

(75) Inventors: Eric Jasinski, Colchester; Douglas W. Kemerer, Essex Center, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/770,844

(22) Filed: Jan. 26, 2001

(51) Int. Cl.$^7$ ................................................ G11C 11/00
(52) U.S. Cl. ........................ 365/154; 365/226; 365/63
(58) Field of Search ................................. 365/154, 164, 365/63, 226, 51, 72

(56) References Cited

U.S. PATENT DOCUMENTS

| | | | | |
|---|---|---|---|---|
| 4,785,427 A | * | 11/1988 | Young | ........................ 365/189 |
| 5,122,846 A | * | 6/1992 | Haken | ........................ 357/23.4 |
| 5,162,889 A | * | 11/1992 | Itomi | ........................ 257/69 |
| 5,654,915 A | * | 8/1997 | Stolmeijer et al. | .......... 365/156 |
| 5,923,059 A | | 7/1999 | Gheewala | |
| 5,991,224 A | | 11/1999 | Aipperspach et al. | |
| 6,103,579 A | * | 8/2000 | Violette | ...................... 438/279 |

* cited by examiner

Primary Examiner—David Nelms
Assistant Examiner—Thong Le
(74) Attorney, Agent, or Firm—Whitham, Curtis & Christofferson, P.C.; Mark F. Chadurjian

(57) ABSTRACT

A memory cell layout provides for sharing of power supply connections between adjacent rows and columns of a memory array, respectively by providing a subarray layout in which one power connection is serpentine, extending into adjacent rows, and another stitches together a connection of memory cells in adjacent columns and adjacent rows. The subarray layout may be expanded by reflection and produced by lithographic exposures of relatively large numbers of memory cells in a step-and-repeat fashion. The layout of the power connections to the memory cells allows a significant reduction in the number of power connections required and/or the provision of redundant connections and a shielding mesh without increase of the number of connections required as well as full exploitation of minimum feature size with increased manufacturing yield.

20 Claims, 10 Drawing Sheets

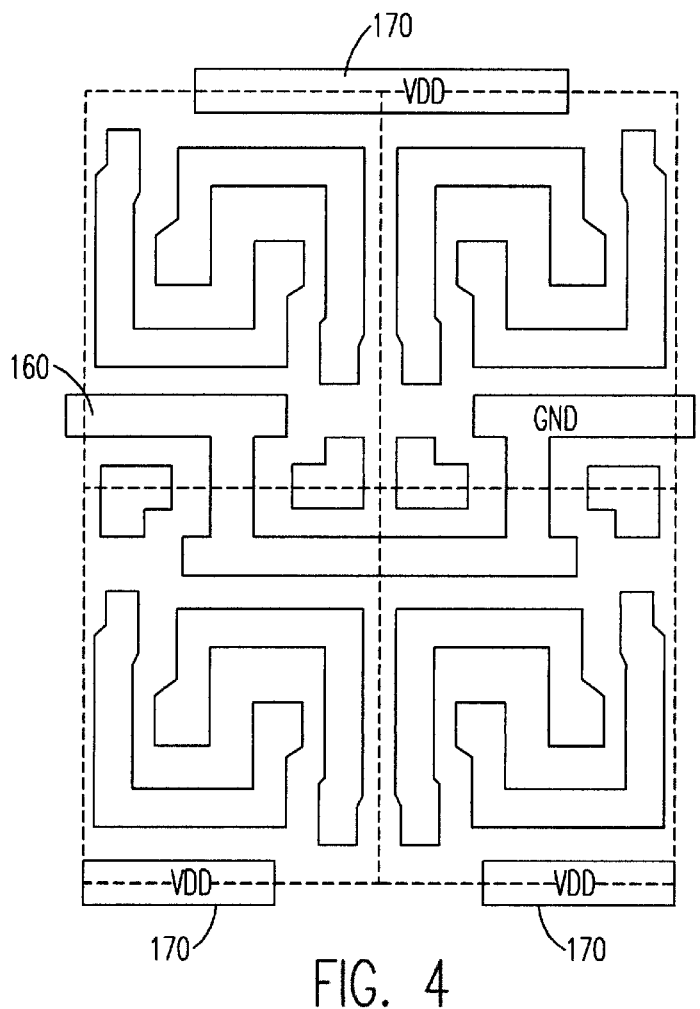
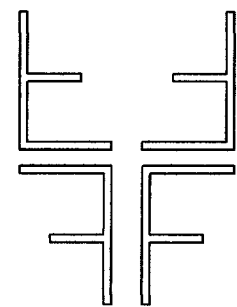
FIG. 4A
FIG. 4
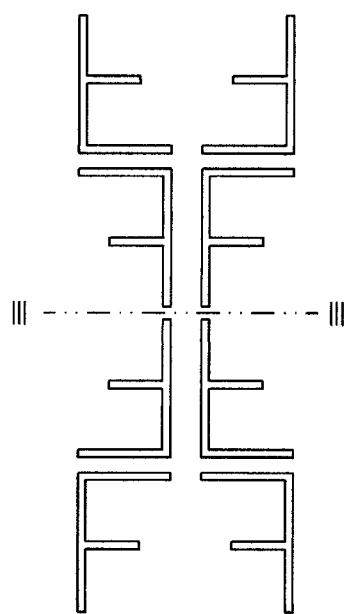
FIG. 5

▨ AGGRESSIVE M1 SPACE
▦ M1 OPENING

SHARED GROUND SRAM CELL

BACKGROUND OF THE INVENTION

1. Field of the Invention

The present invention generally relates to semiconductor integrated circuit memory arrays and, more particularly, to static random access memory arrays formed at extremely high integration density.

2. Description of the Prior Art

Increased integration density yields advantages in performance and functionality of integrated circuits as well as increased economy of manufacture since reduced size of electronic elements, such as transistors, allows a greater number of such elements to be formed on a chip of a given size while increased proximity between devices allows reductions in signal propagation time. In regard to integrated circuit memory arrays, increased integration density allows more data to be stored per chip and potential improvements in operating margins. Therefore, there is a strong incentive toward manufacture of integrated circuit memories at reduced minimum feature size regimes.

The minimum feature size is an extremely important parameter of the design rules for a given integrated circuit. The minimum feature size refers to the minimum allowed transverse dimension for a lithographically defined feature (although the current state of the art allows some structures, such as transistor gate sidewalls, to be formed at sub-lithographic dimensions) and also applies to the minimum permitted spacing between features such as wiring. In general, conductors must be formed in segments in a metallization layer while another layer is used to connect the segments though contact vias in an intervening insulation layer. Such a structure requires high accuracy of registration between the metal layers and the contact locations between them. Therefore, there is a trade-off between greater spacing between conductive segments in any layer to increase registration tolerance and the ultimate integration density that can be achieved. Accordingly, space between conductors is generally made very close to the minimum feature size even though manufacturing yield may be somewhat compromised.

Further, since the minimum feature size is necessarily limited by lithographic resolution, the features of the lithographic images will be degraded somewhat by rounding and foreshortening of ends of conductors, particularly as minimum feature size is reduced. Because conductors extend between connection locations (e.g. vias) foreshortening or rounding of the ends of conductors may reduce the area of the conductor which overlaps the connection structure and potentially result in an open circuit unless the lithographic image is adjusted to increase dimensions at the ends of conductors so that the overlap area will not be significantly reduced.

Such an adjustment is referred to as an optical proximity correction (OPC) anchor and necessarily reduces the distance between conductors, at least in the image used to expose the lithographic resist, so that the intended spacing will be substantially restored in the resulting conductor shape. Increase of conductor length beyond a connection structure by an OPC anchor is referred to as an extension and an increase of width of a conductor by an OPC anchor at a connection structure is referred to as a tab. Tabs and extensions may be used independently or in combination. Such aggressive design reduces the lithographic process window and compromises manufacturing yield.

It is also generally the case that such aggressive design spaces require adjustment of routing of other connections, often requiring segments of connections to be run diagonally. Diagonal segments are more difficult to expose lithographically since they require angled shapes to be produced and, in general, imply that other space on the chip will be used less than optimally. Diagonal conductors may also imply other complications of layout to limit capacitive coupling to other elements of the integrated circuit.

Another complication of circuit layout for static random access memories (SRAMs) is the need to provide power to the active devices in the cell which form a bistable circuit which comprises a memory cell as well as connections to carry stored data signals to and from the cell and provide for cell selection. At the current state of the art, it is generally preferred to provide data in both true and inverse logic states over a selected pair of bit lines and to use an additional word line, orthogonal to the selected bit line pair, for cell selection. A power supply line ($V_{DD}$) and a power return path (e.g. GND) must also be provided. These five connections to each cell complicate the design layout over large arrays because of the connections which must be made between the power supply and return lines for many rows (or columns) of memory cells in order to limit voltage drops across the array and to assure that all cells of the array receive substantially the same voltage at all times. In general, arrangement of memory cells in mirrored pairs has provided some simplification of these connections but many segments of power supply conductors and a large number of I/O pins are required for satisfactory operation and operating margins.

SUMMARY OF THE INVENTION

It is therefore an object of the present invention to provide a memory cell layout having improved connection coverage/overlap with improved manufacturing yield.

It is another object of the invention to provide a memory cell array in which the size of memory cell can fully exploit the minimum feature size of the design rules without significant compromise of manufacturing yield.

It is a further object of the invention to provide a memory cell array having a reduced number of internal and external connections to the chip.

In order to accomplish these and other objects of the invention, a static memory cell is provided including a bistable circuit, a first power connection to the bistable circuit having a first end abutting a first side of the memory cell and a second end abutting a second side of said memory cell adjacent the first side of the memory cell, and a second power connection to the bistable circuit having a first end abutting a third side of the memory cell and a second end terminated at a via within the memory cell.

In accordance with another aspect of the invention, a memory array is provided including a serpentine power connection shared between memory cells of adjacent rows of memory cells of said memory array, and a further power connection shared between memory cells of adjacent columns of memory cells of said memory array.

BRIEF DESCRIPTION OF THE DRAWINGS

The foregoing and other objects, aspects and advantages will be better understood from the following detailed description of a preferred embodiment of the invention with reference to the drawings, in which:

FIG. 4 is a plan view of an array of four memory cells having respective orientations represented in FIG. 4A, FIG. 5 is a representation of the orientation of respective memory cell circuits in accordance with the invention for an eight cell array, FIGS. 6A, 6B, 6C and 6D form a morphological sequence useful in explaining the meritorious effects of the invention relative to the memory cell of FIG. 2.

DETAILED DESCRIPTION OF A PREFERRED EMBODIMENT OF THE INVENTION

Figures 1, 1A:
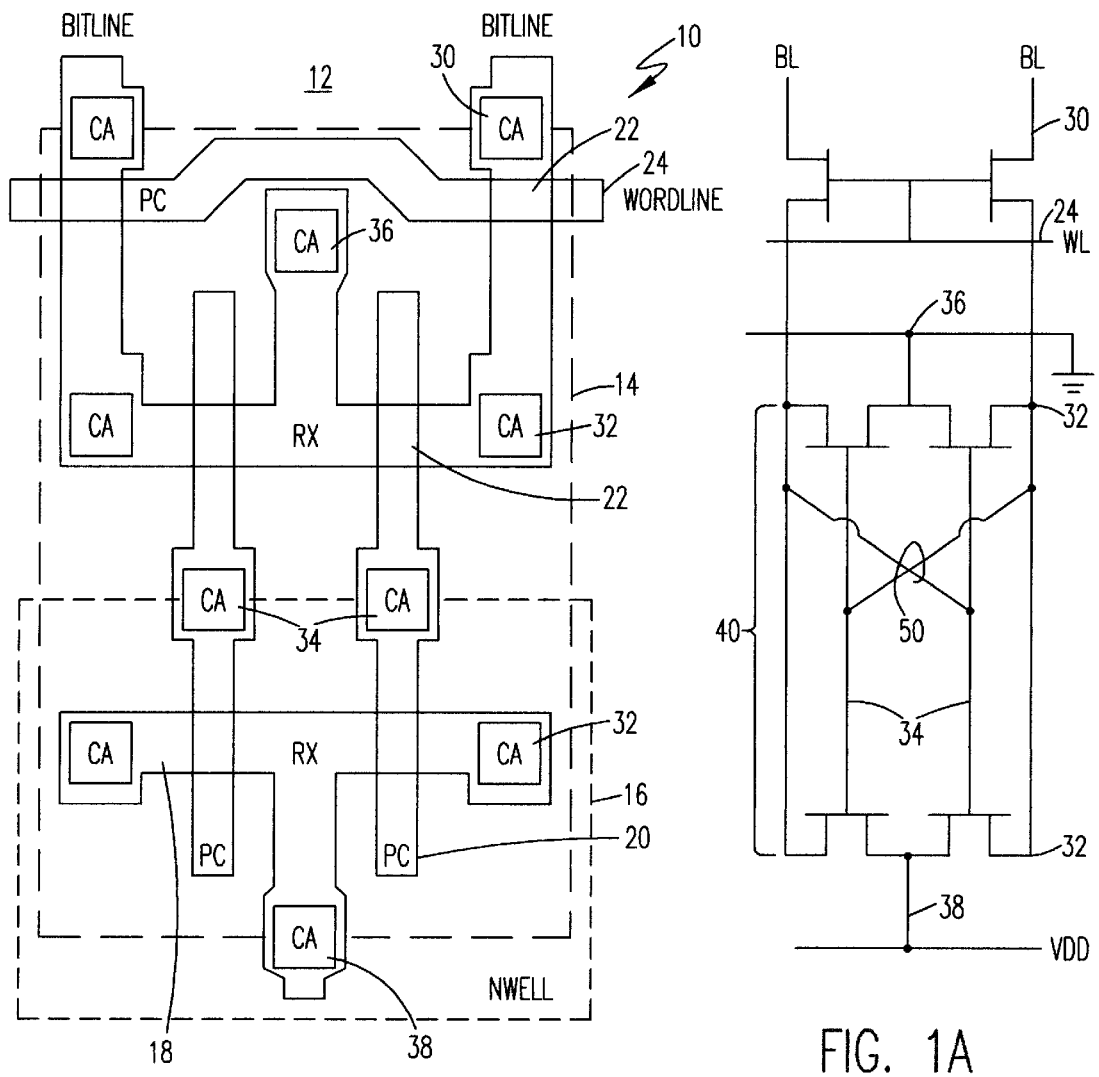
FIG. 1 is a plan view of the active elements of a memory cell accommodated by the invention.
FIG. 1A is a schematic diagram of the circuit formed by the active elements of FIG. 1 in a corresponding layout.
Figure 2:
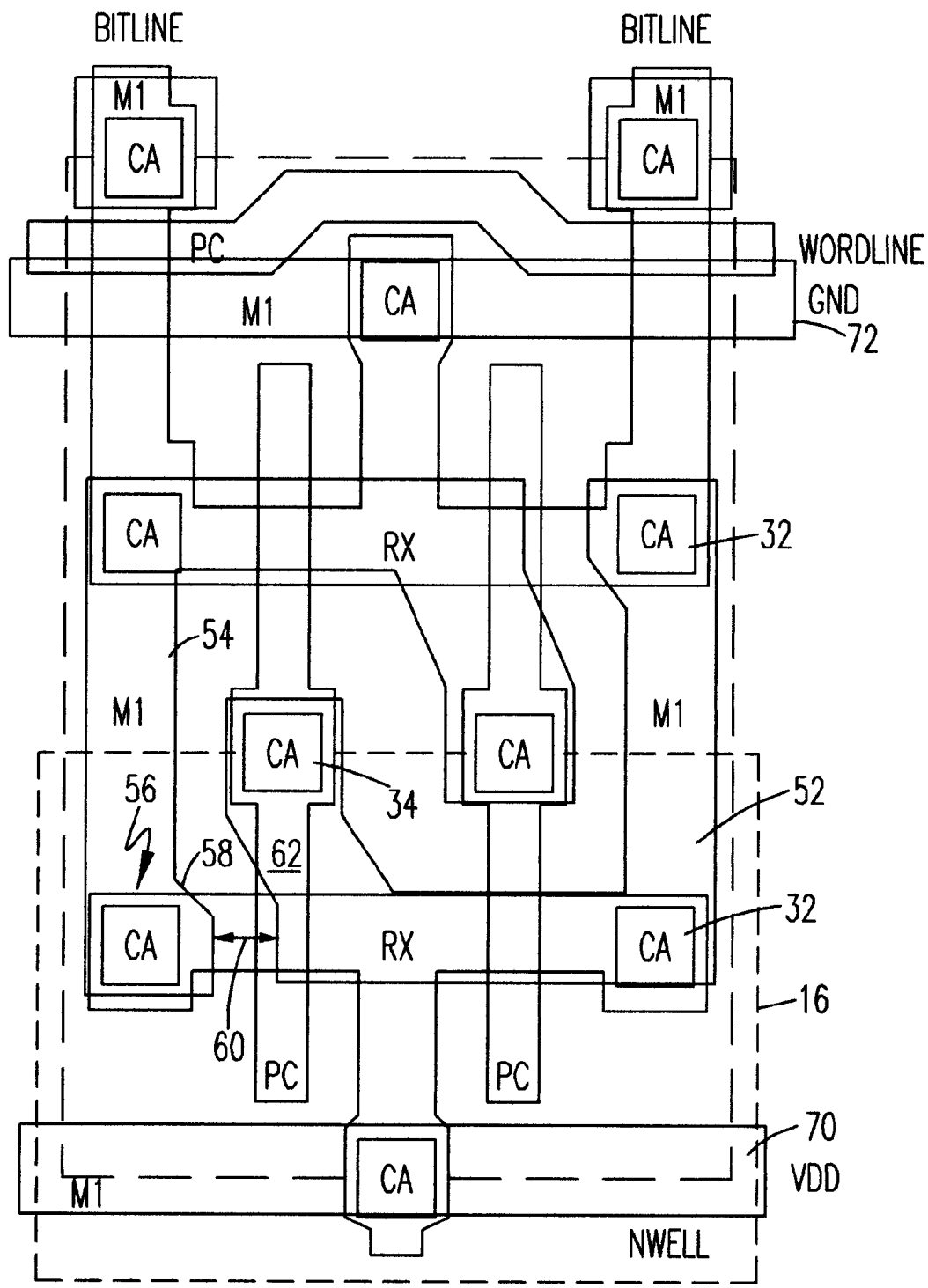
FIG. 2 is a plan view of connections formed in a first metal (M1) layer for the memory device active element layout of FIG. 1 over which the present invention provides an improvement.
Figures 3, 3A:
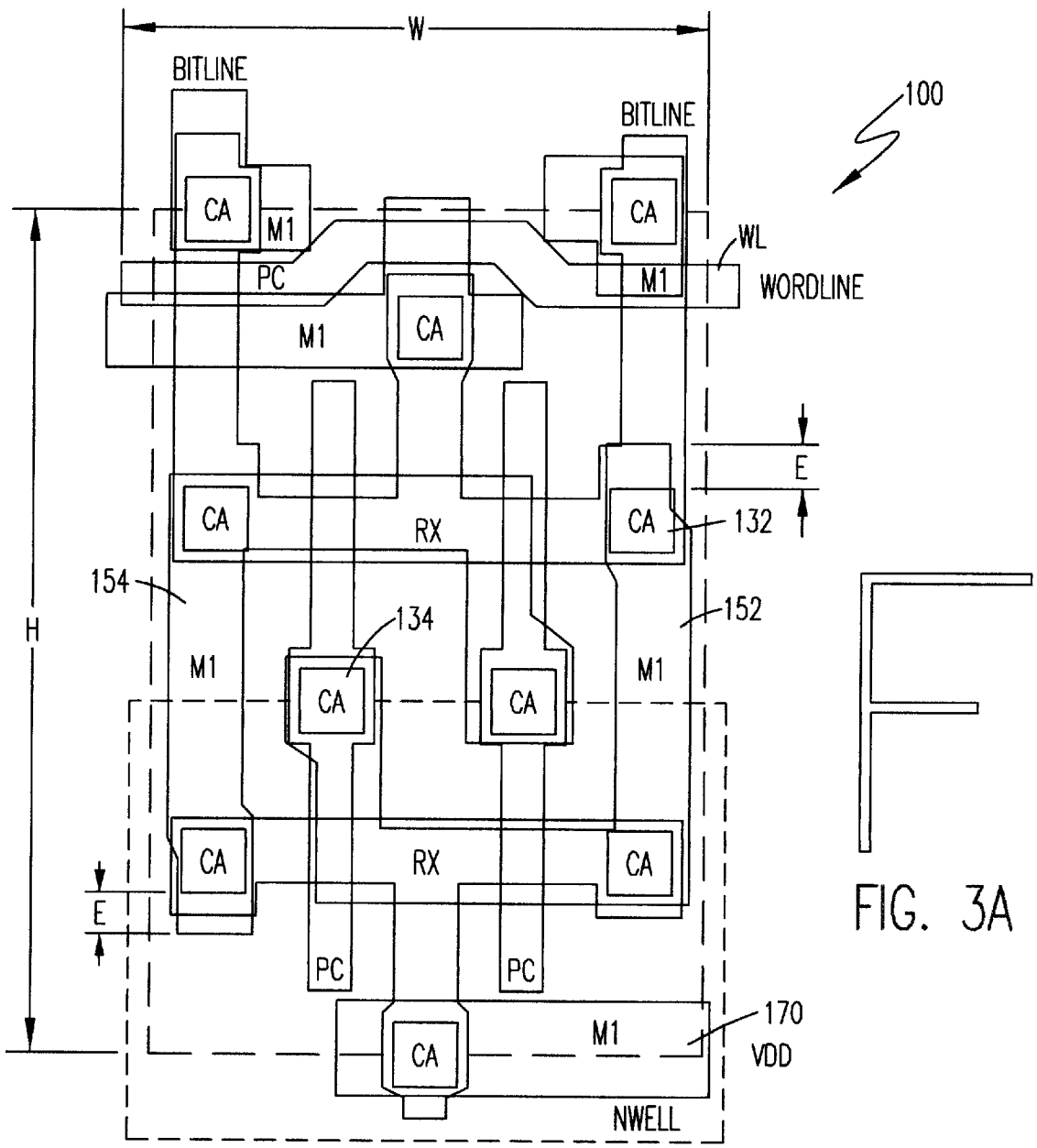
FIG. 3 is a plan view of the first metal layer of a memory cell in accordance with the invention in an orientation which can be represented, for simplicity, as shown in FIG. 3A.
Figure 8:
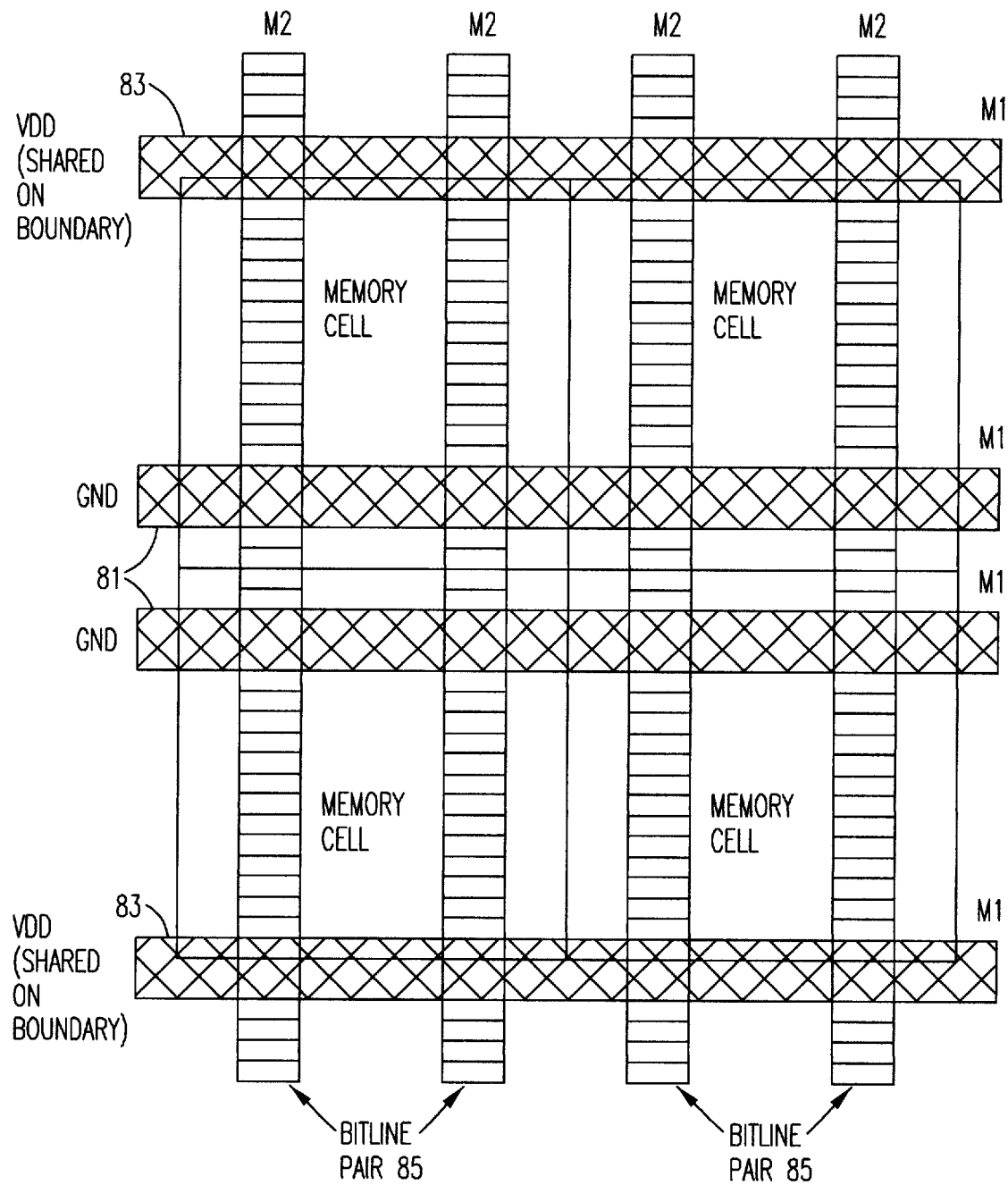
FIGS. 8 and 9 illustrate conventional wiring techniques for memory cell subarrays not including the invention.

Referring now to the drawings, and more particularly to FIG. 1, there is shown, in plan view, a layout pattern of the active elements of a memory cell 10 accommodated by the invention. This depiction and the depiction of FIG. 2 are to be considered as exemplary and arranged to convey an understanding of the invention and its meritorious function and are not admitted to be prior art as to the present invention. It should also be appreciated that the active element layout illustrated in FIG. 1 is substantially the same as depicted in FIG. 3, illustrating the invention, and is intended to demonstrate that the application of the principles of the invention to a memory cell or array does not require alteration of the active element layout design but, in general, will permit overall memory cell size to be reduced. Accordingly, FIGS. 1 and 2 and FIG. 8 showing an exemplary connection of an array of cells corresponding to FIG. 2 have been designated as "Related Art".

In FIG. 1, areas labelled RX on substrate 12 (e.g. region 18) are diffusions and areas labelled PC (e.g. region 20) are, for example, polysilicon deposits forming conductors insulated from substrate 12. The area of the overall memory cell is depicted by dashed line 14. This memory cell is assumed, for purposes of this discussion, as being formed in accordance with CMOS technology using an N-well 16 in a P-type substrate 12. Regions (e.g. 22) where the polysilicon deposits PC/20 overlap a diffusion region RX/18 form transistors. Regions labelled CA are contacts to the source, drain or gate of each transistor 22. A contact to word line 24 is assumed, for purposes of this discussion, to be outside the memory cell.

These contacts are connected by a pattern of conductors in a first metal layer M1 illustrated by regions so labelled in FIG. 2 and form a bistable circuit schematically depicted in FIG. 1A; corresponding in layout to FIG. 1. The bistable circuit 40 comprises, for example, two CMOS pairs of transistors connected in series between $V_{DD}$ and GND which are cross-coupled as shown at 50 to form a flip-flop circuit in a manner well-understood in the art. That is, there is a common node connecting connection points 32 of one pair of transistors and the gate connection 34 of the other pair of transistors. Data signals selectively placed on the bit line (BL) connections 30 are selectively gated by the logic signal on the wordline WL 24. It should be understood that many variations on such memory cell circuits are known but virtually all will share the cross-connection 50 in some form. By the same token, other types of memory cells such as two-port SRAMs and static content addressable memories (CAM) will also include such a cross-connection to which the present invention is particularly applicable. It is this connection which presents a major difficulty in manufacture at high integration density that is overcome by the present invention.

Specifically, the nodes formed by metallization regions 52 and 54 form the cross-connection 50 and thus must have a curved or angled line form with a portion of one metallization region interposed between portions of another. This inherent constraint presents a pattern of conductors and spaces extending across the memory cell (as can be observed, for example, along the edge of N-well 16). The ends and angles of these metallization regions 52 and 54 are defined by the locations of connection points 32 and 34 which must be fully covered (or as nearly so as possible) in order to avoid increasing resistance of the contacts or, as a worst case, an open circuit. The ends of these metallization regions 52, 54 (and to a lesser extent, the corners of the angles) will be subject to rounding and foreshortening lithographic effects as the width of the regions approaches the resolution limit of the lithographic tool, as discussed above.

Therefore, to provide adequate overage or overlap of the connection points by the ends of the metallization regions 52, 54, an optical proximity correction (OPC) anchor must be applied to the lithographic exposure pattern (in the form of a tab at 56 and in the form of an extension at 34). The oPc 56 generally takes the form of a rectangular enlargement of the end of a pattern but some diagonal shaping is often applied, as shown at 58. It can be observed from FIG. 2 that the application of an OPC 56 causes a critical spacing in region 60 and aggressive design patterning including inefficient diagonal shapes in region 62 to provide minimum feature size separation between conductors 52 and 54, as imaged.

It should be understood that a minimum feature size separation must be provided in the lithographic exposure pattern to allow the space to be imaged at all if the minimum feature size is close to the resolution limit of the lithography exposure tool. Of course, this implies that the separation in the completed metal pattern is likely to be much greater than the minimum feature size due to rounding and foreshortening effects discussed above which, in turn, imposes a limit of integration density that does not fully exploit the potential of the minimum resolvable feature size.

Referring now to FIG. 3, the invention will now be explained. For convenience and clarity, the memory cell circuit is the same as that shown in FIG. 1A and the layout of the active elements of the memory cell circuit is similar to that of FIG. 1. However, it should be noted that the width W and height H of the memory cell is significantly reduced by virtue of the invention. For reference, this layout orientation is represented by the letter "F" of FIG. 3A. Again, it should be understood that as with FIG. 2, the metallization pattern shown in FIG. 3 corresponds to the exposure pattern and only to a lesser degree, the metallization pattern realized on the chip.

Other than in overall size, the pattern of FIG. 3 differs from that of FIG. 2 in accordance with the invention principally by the extension E of connections 152 and 154 beyond the connection points 132. Further, additional area and flexibility of layout is provided at bit line connections. These changes could not be accomplished in the pattern of FIG. 2 where the power supply connections are formed to pass along a substantially straight line through the memory cell. This extension E avoids any need for an OPC anchor in the form of a tab since any rounding and foreshortening effects occurring at or from the ends of the connections will be limited to regions beyond the connection points 132. Accordingly, since large OPC anchor exposure pattern modifications are not necessary and aggressive layout designs are unnecessary, it is seen that the invention provides for a memory cell to be made at a smaller size which more fully exploits the minimum feature size and lithographic tool resolution at an increased manufacturing yield.

It should be noted, however, that the power connections depicted in FIG. 3 do not run through the entire memory cell and that the cell of FIG. 3 cannot be laid out in simple reflected pairs; both of which have proven to be of convenience in known memory cell arrays. In other words, the power connection layout and/or the layout of the memory cell array in reflected pairs would preclude the approach to increased integration density and/or manufacturing yield provided by the invention and vice-versa. Accordingly, the approach of the present invention is highly counter-intuitive and provides a memory cell layout with much greater advantages in both integration density and array connection wiring that will be discussed in greater detail below.

Figure 6A:
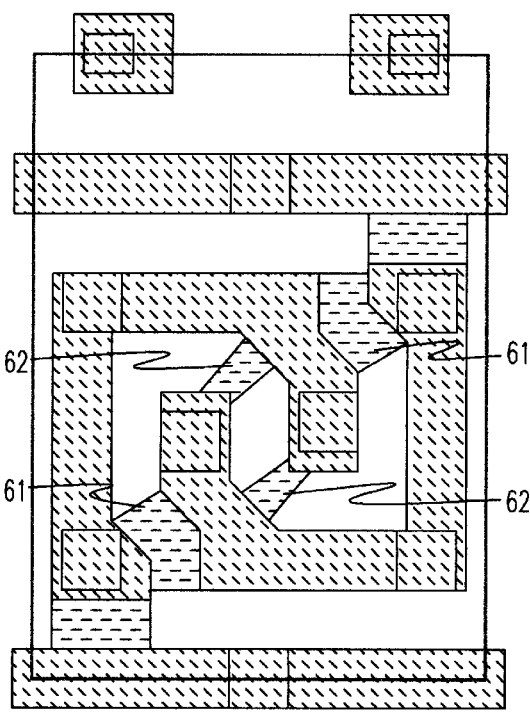
Figure 6B:
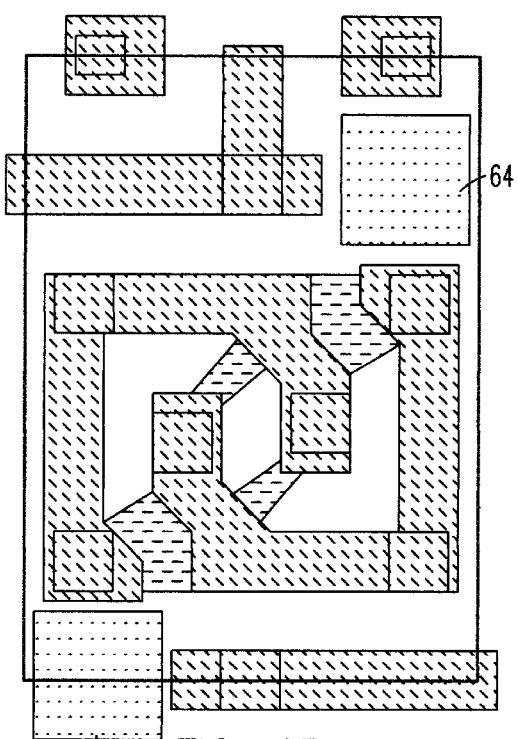
Figure 6C:
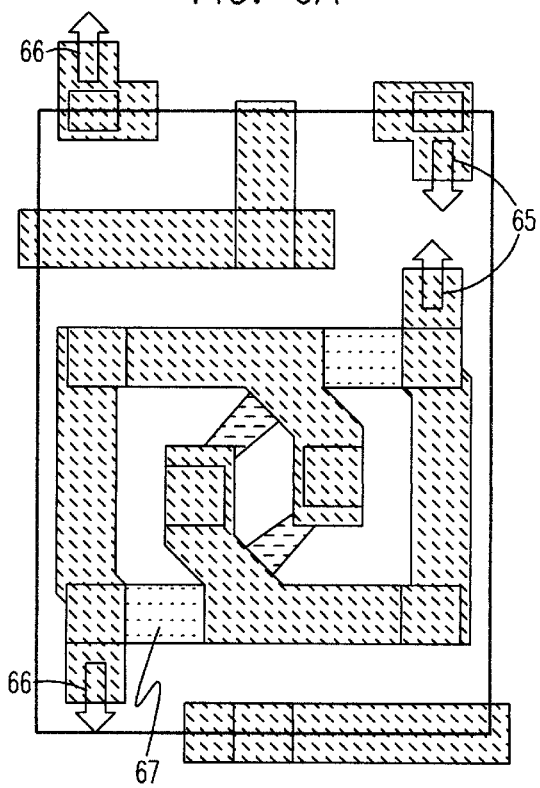
Figure 6D:
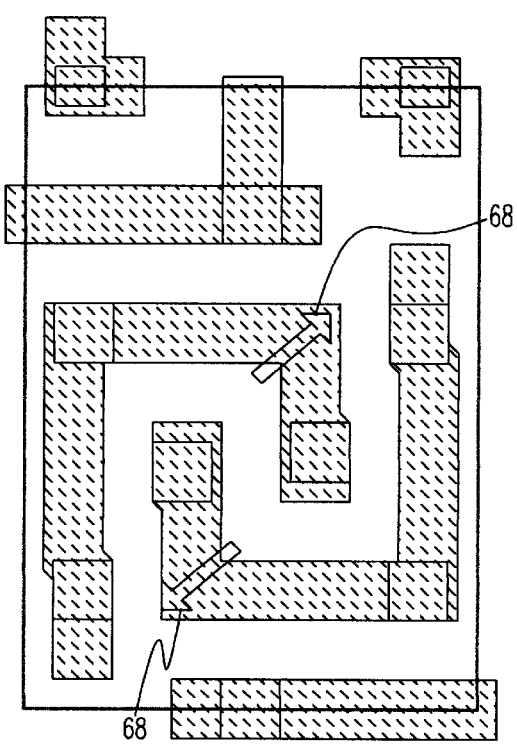

This conflict between the invention and known and widely adopted layout conventions can be better understood from the morphological sequence of FIGS. 6A–6D. FIG. 6A corresponds substantially to the layout of FIG. 2 with the power connections running directly through the memory cell in a substantially linear fashion. This results in symmetrically disposed critical spacing regions 61, 62 where aggressive layout design must be employed with attendant small process windows, overall cell size or footprint which does not fully exploit the minimum resolvable feature size and reduced manufacturing yield. However, if the conventional layout of the power connections is not employed, space is provided in regions 63 and 64 as shown in FIG. 6B. These spaces 63, 64 allow the exposure pattern to be extended at the ends of the cross-coupling connections 50 as shown in FIG. 6C in order to avoid the need for OPC anchor tab patterns, relieves the critical space regions 61 and provides space 67. The critical space regions 62 can then be relieved by removing the diagonal regions of the cross-coupling connection as shown in FIG. 6D.

Returning now to FIGS. 4 and 4A, it will be recalled that the memory cell layout in accordance with the invention does not follow the convention of providing power connections which are substantially linear across the cell and, for that reason, cannot be arrayed as simple reflected pairs of cells, as is the current practice. Rather, the layout in accordance with the invention provides two power connections which are serpentine in the M1 plane (with a pitch of turns substantially equal to the memory cell pitch in the direction of the serpentine conductor) and serpentine or otherwise connected between the M1 and another plane (with a via/connection pitch substantially equal to the memory cell pitch in the direction of the conductor), respectively; which has significant advantages in fabrication, design and performance, as will be discussed below.

It will be recalled from FIGS. 3 and 3A that the layout of FIG. 3 is asymmetrical and that layout is represented by the letter "F" of FIG. 3A. (The letter "F" has no intended significance in regard to the invention and is used simply because it is the first letter of the alphabet which can have no axis of symmetry and for which the asymmetries are particularly clear visually.) However, three other layouts can be generated by reflection of the pattern of FIG. 3 and grouped together in ways which are symmetrical about several different axes, through which power, signal (e.g. bit line) and selection (e.g. word line) connections can be completed from cell-to-cell.

It may be helpful to observe from FIGS. 3 and 3A that the open or right side of the letter "F" corresponds to the side of the memory cell which is reached by the $V_{DD}$ connection but not by the GND connection and that the top of the letter "F" corresponds to the side of the memory cell toward or from which the GND connection turns from or toward the closed or left side of the letter "F". (These attributes of the respective $V_{DD}$ and GND lines could be reversed with the $V_{DD}$ connection angled. However angling of the GND line is preferred since the GND line is located a sufficient distance from the edge of the cell layout to do so whereas angling of the $V_{DD}$ connection would increase the overall size of the memory cell layout.) The word line WL extends through the cell, as in FIG. 1, between sides of the memory cell corresponding to the closed/left and open/right sides of the letter "F" and generally parallel to the top side thereof.

FIG. 4 shows the memory cell layout of FIG. 3 replicated four times in four different reflections in the four quadrants thereof, respectively. The relative orientation of these layout reflections is illustrated in FIG. 4A. It will be noted that the layout orientations of FIGS. 3 and 3A appear in the lower right quadrant of FIGS. 4 and 4A, respectively, although it will be appreciated by those skilled in the art that the four cell array of FIGS. 4 and 4A (and the eight cell array which will be discussed below in regard to FIG. 5) is an arbitrary portion of a much larger array and the following discussion of the four-cell array illustrated is equally applicable to any four-cell, 2×2 subarray in the overall array which may be of arbitrarily large extent.

The layout of the four cell subarray of FIG. 4 provides a serpentine but continuous shape to the GND line in the Ml plane. Thus, the "tops" of the letter "F" are abutted (or opposed) between vertically adjacent cells and oppositely oriented between both vertically and horizontally adjacent quadrants. In other words, the layout pattern is rotated 180° between vertically adjacent cells and reflected about a vertical axis between horizontally adjacent cells. Thus, if the angle in the ground/GND line is central to each memory cell layout (as it should be; contacting diffusion contact 30), results in the serpentine GND line 160. By the same token, when the $V_{DD}$ line is terminated within the cell beyond the overlap of diffusion connection 38, end regions of $V_{DD}$ lines will be aligned between both horizontally and vertically adjacent cells and can be stitched together readily in another (e.g. second, M2) wiring level.

FIG. 5 shows how the array of the four cell layout of FIG. 4A is preferably reflected about a horizontal axis iii-iii (or a vertical axis) to form the layout of an eight cell subarray having the same cell-to-cell connection properties as the four cell subarray of FIGS. 4 and 4A. This array is fully symmetrical about both horizontal and vertical axes and can be repeated as desired (reflections yield the same pattern as step and repeat iterations and vice-versa) to yield repeatable subarrays of larger size; any of which can repeatedly formed by a step and repeat process to form a memory cell array of any desired size. Such a development of a relatively large subarray which can be used to tile a memory chip in this fashion can greatly increase the throughput of lithographic exposure tools, particularly as cell size is decreased at increased integration densities.

In view of the foregoing, it is seen that the invention provides improved coverage of connection points while largely avoiding space concerns that require aggressive layout design and reduced manufacturing process windows that may compromise manufacturing yield and prevent full exploitation of the minimum feature size. Since these space concerns are avoided, the layout of the memory cell can fully exploit the minimum feature size ground rules and lithographic exposure tool resolution to maximize integration density at high manufacturing yield.

Figure 7:
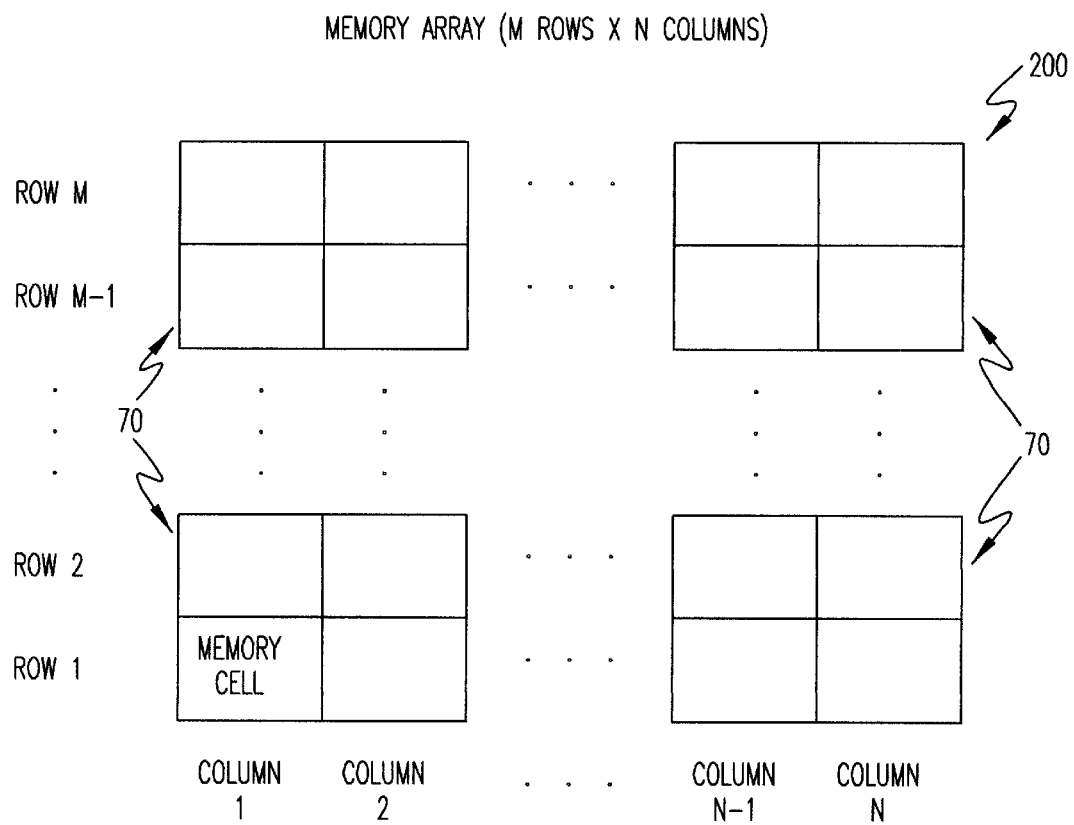
FIG. 7 is a diagram illustrating subarrays of cells in a memory cell array which will be useful in explaining additional advantages of the invention.

Referring now to FIG. 7, a generalized memory 200 cell array of arbitrary extent is symbolically depicted in plan view. This Figure is intended to show a numbering arrangement which will be useful in understanding further advantages of the present invention in regard to wiring of the memory array. In FIG. 7, four subarrays 70 of four memory cells each, such as that of FIG. 4, are schematically shown to indicate the extremes (e.g. corners) of a memory cell array arranged in rows and columns of arbitrary number. Columns are numbered 1 to n from left-to-right and rows are numbered 1 to m from bottom to top. This numbering convention will be followed in the following discussion of FIGS. 8–11.

FIG. 8 shows conventional bit line wiring of a subarray of memory cells such as could be employed with a memory cell having a layout similar to FIG. 1. In this case, the bit lines pairs for each column of cells run vertically, as illustrated, in a different wiring layer (e.g. M2) from that used for power distribution. As discussed above, the power connections 81, 83 run through the cells in the horizontal direction, as illustrated, in a single wiring level (e.g. M1). For this wiring arrangement, the minimum number of connections lines would be n bitline pairs 85, m GND lines and m/2 $V_{DD}$ lines since the $V_{DD}$ lines 83 can be shared between subarrays at the subarray boundaries. Additional, redundant power connections can be provided, if desired.

Figure 9:
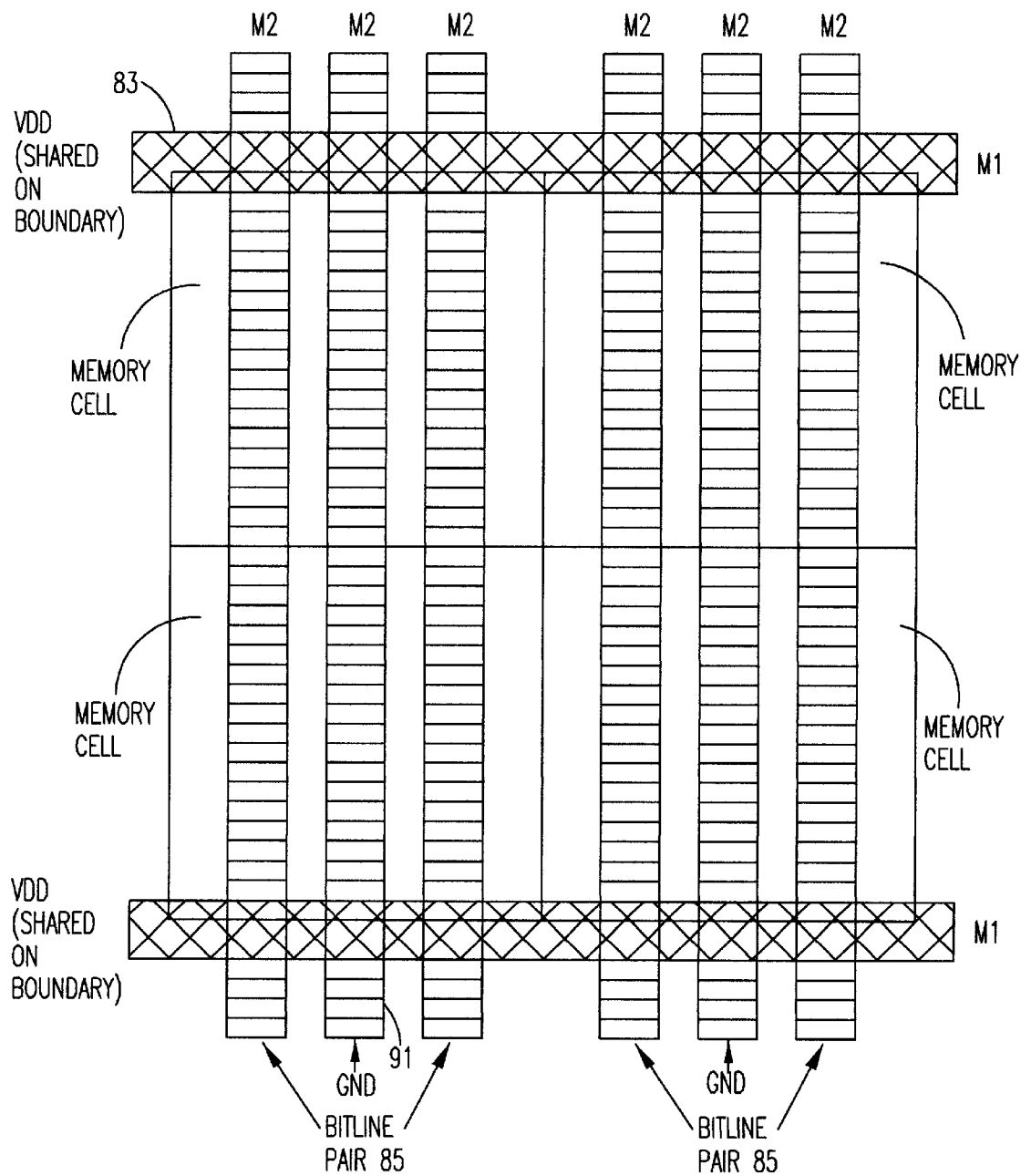

FIG. 9 shows an alternative arrangement which may provide some reduction in the number of wiring lines, depending on the relative values of m and n. In this arrangement, the $V_{DD}$ lines run horizontally through the cells at the M1 level and are shared between subarrays at the subarray boundaries as in the arrangement of FIG. 8. The GND wiring lines 91 are run between the bit line pairs 85 for each column and in the same (e.g. M2) layer as the bit lines. The minimum number of connections would be n bit line pairs, n GND lines and m/2 $V_{DD}$ lines. This arrangement thus provides an advantage over that of FIG. 8 only if m is greater than n.

Figure 10:
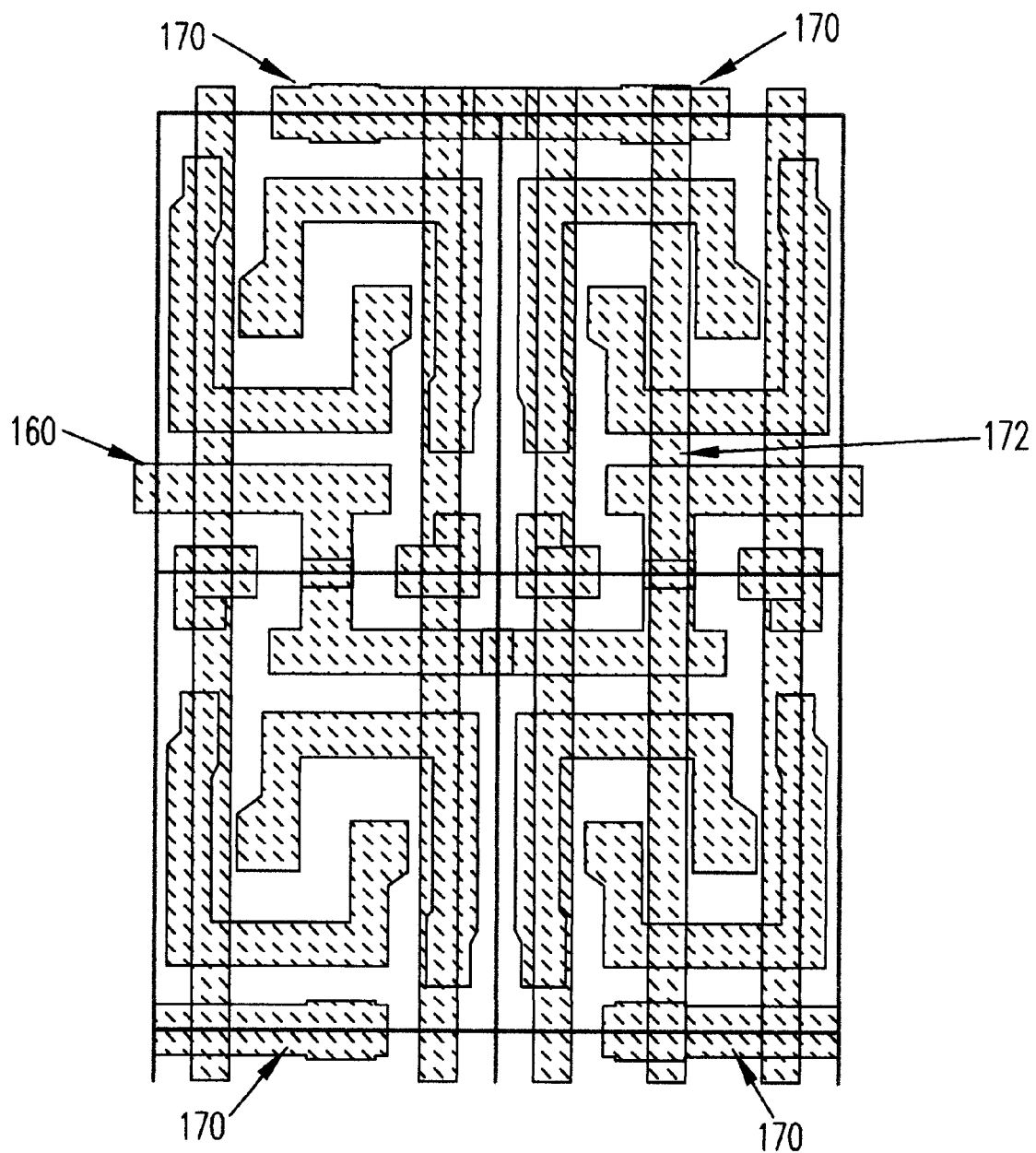
FIGS. 10 and 11 are plan views of a subarray portion of a memory array illustrating reduction of power connections to memory cells in accordance with the invention.

Referring now to FIG. 10, a possible wiring arrangement in accordance with the invention will now be discussed. It should be appreciated that the subarray schematically depicted corresponds to that shown in FIG. 4. Serpentine connection 160 allows a single GND line in the M1 level to be shared between two rows of cells, as discussed above. The layout of the subarray of FIG. 4 allows a single $V_{DD}$ connection to be shared between two adjacent cells in each row (and extending to an adjacent subarray in alternate rows) where connections 170 abut an adjacent cell. These VDD connections 170 may be stitched together, as alluded to above, by connections 172 running between bit lines of alternate bit line pairs. Therefore, the number of power connections required for the arrangement of FIG. 10 is n bit line pairs (as before), m/2 GND lines (half that of FIG. 8) and n/2 $V_{DD}$ lines (fewer than FIG. 9 if n is less than m). Only two wiring layers are involved and one may be common to the bit lines. Thus, it is seen that the invention allows a substantial reduction in the number of power connections, especially in the M2 wiring layer, while supplying power to all memory cells of the array, regardless of the extent of the array.

Figure 11:
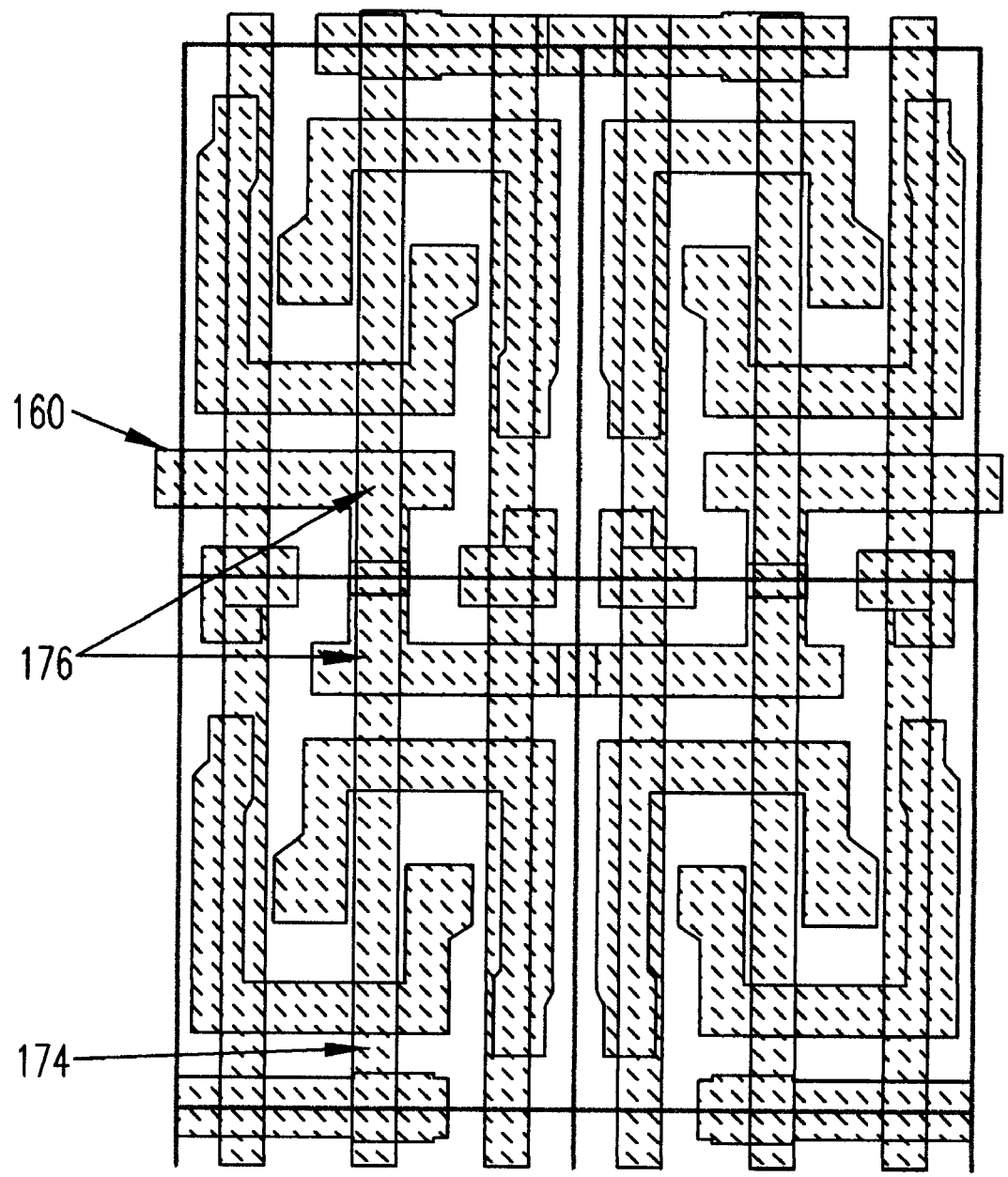

Referring now to FIG. 11 a wiring arrangement which is more robust by inclusion of redundant GND connections is shown. This arrangement is similar to that of FIG. 10 except that a redundant GND connection 174 is run between alternate bit line pairs at the M2 level and redundant connections 176 are made at turns of the serpentine GND connection 160.

This connection arrangement not only provides a high level of redundancy but essentially forms a ground plane mesh which provides significant noise shielding. This arrangement requires n bit line pairs (as before), n/2+m/2 GND lines (fewer than FIG. 8 if n is less than m) and n/2 $V_{DD}$ lines (fewer than FIG. 8 if n is less than m and the same a FIG. 9 while redundant connections are now provided). In other words, the arrangement of FIG. 11 provides redundant ground connections and shielding for the memory array with no increase in the number of conductors required in the M2 wiring level. Additionally redundant connections could be provided for the $V_{DD}$ connections, if desired, in an additional wiring level. However, it should be understood that a further wiring level would be required for any redundant connections for either of the VDD or GND connections in the arrangement of FIG. 9. It should also be understood that FIGS. 10 and 11 represent arrangements with minimized number of connections and maximized redundancy, respectively and other arrangements employing features of both to intermediate degrees will be apparent to those skilled in the art in view of the above discussion.

In view of the foregoing, it is seen that the invention provides a memory cell and subarray layout which allows exploitation of the full resolution and minimum feature size that can be developed by a given lithography tool without aggressive layout design that can reduce process windows and manufacturing yield. The memory cell and subarray layout also provides the additional benefits of simplification of power supply wiring or shielding and redundant connections without increase of the number of M2 connections.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A static memory cell including
   a bistable circuit,
   a first power connection to said bistable circuit having a first end abutting a first side of the memory cell and a second end abutting a second side of said memory cell, said second side being adjacent said first side, and
   a second power connection to said bistable circuit having a first end abutting a third side of said memory cell and a second end terminated at a via within said memory cell.

2. A static memory cell as recited in claim 1, wherein said second power connection is located along a fourth side of said memory cell.

3. A memory array including
   a serpentine power connection shared between memory cells of adjacent rows of memory cells of said memory array, and
   a further power connection shared between memory cells of adjacent columns of memory cells of said memory array.

4. A memory array as recited in claim 3, wherein said serpentine power connection is continuous in a single metal level.

5. A memory array as recited in claim 4, wherein said single metal level is a first metal level over active devices and an insulator layer.

6. A memory array as recited in claim 3, wherein said serpentine power connection is a GND connection.

7. A memory array as recited in claim 5, wherein said serpentine power connection is a GND connection.

8. A memory array as recited in claim 3, wherein said further power connection includes segments shared between pairs of memory cells in adjacent columns and connections in a second metal level.

9. A memory array as recited in claim 8, wherein said second metal level is common to bit lines of said memory array.

10. A memory array as recited in claim 3, wherein said memory array includes m×n memory cells arranged in m rows and n columns.

11. A memory array as recited in claim 10, including m/2 serpentine conductors and n/2 further power connections.

12. A memory array as recited in claim 11, further including n/2 redundant connections between said serpentine connections.

13. A memory array as recited in claim 12, wherein said serpentine connections and said redundant connections form a mesh.

14. A memory array as recited in claim 9, wherein said further power connections are located between bit lines of alternating pairs of bit lines.

15. A memory array as recited in claim 12, wherein said redundant power connections are located between bit lines of alternating pairs of bit lines.

16. A memory array as recited in claim 15, wherein said further power connections are located between bit lines of other alternating pairs of bit lines.

17. A memory array as recited in claim 3, wherein said memory cells are static random access memory cells.

18. A memory array as recited in claim 3, wherein said further power connection is formed in segments in a first metal layer and is formed in continuous lines orthogonal to said segments in a second metal layer.

19. A memory array as recited in claim 18, wherein said segments and said continuous lines are connected by vias.

20. A memory array as recited in claim 3, wherein a layout pattern of memory cells is rotated 180° between vertically adjacent cells and reflected about a vertical axis between horizontally adjacent cells.

* * * * *